United States Patent
Allers et al.

(10) Patent No.: US 7,626,222 B2
(45) Date of Patent: Dec. 1, 2009

(54) CAPACITOR ARRANGEMENT IN A SEMICONDUCTOR COMPONENT AND DRIVING APPARATUS

(75) Inventors: Karl-Heinz Allers, Haar (DE); Reiner Schwab, Hausham (DE)

(73) Assignee: Infineon Technologies AG, Munich (DE)

( * ) Notice: Subject to any disclaimer, the term of this patent is extended or adjusted under 35 U.S.C. 154(b) by 424 days.

(21) Appl. No.: 11/408,794

(22) Filed: Apr. 21, 2006

(65) Prior Publication Data

US 2006/0258088 A1 Nov. 16, 2006

Related U.S. Application Data

(63) Continuation of application No. PCT/DE2004/002301, filed on Oct. 15, 2004.

(30) Foreign Application Priority Data

Oct. 22, 2003 (DE) ................ 103 49 557

(51) Int. Cl.
*H01L 27/108* (2006.01)
*H01L 29/94* (2006.01)

(52) U.S. Cl. ............... 257/299; 257/E29.343; 363/59; 363/60; 363/62

(58) Field of Classification Search ............ 363/60, 363/62

See application file for complete search history.

(56) References Cited

U.S. PATENT DOCUMENTS 4,897,774 A 1/1990 Bingham et al.
5,270,913 A 12/1993 Limpaecher
5,274,586 A 12/1993 Matsukawa
5,461,557 A * 10/1995 Tamagawa .................. 363/60
5,668,710 A * 9/1997 Caliboso et al. ............. 363/60
5,734,291 A * 3/1998 Tasdighi et al. ............. 327/537
6,232,169 B1 * 5/2001 Widmann et al. ........... 438/243
6,549,437 B1 * 4/2003 Takeuchi et al. ............. 363/59
7,453,711 B2 * 11/2008 Yanagida et al. ............. 363/59
2001/0015449 A1 8/2001 Niguyen et al.
2003/0057987 A1 3/2003 Ohlhoff et al.

FOREIGN PATENT DOCUMENTS

DE 200 13 501 U1 1/2001
DE 101 45 021 C1 4/2003

* cited by examiner

*Primary Examiner*—Sue Purvis
*Assistant Examiner*—Benjamin P Sandvik
(74) *Attorney, Agent, or Firm*—Slater & Matsil, L.L.P.

(57) ABSTRACT

A semiconductor device includes a first capacitor node, a second capacitor node, a first capacitor electrode, a second capacitor electrode, a first switch and a second switch. The first switch is coupled between the first capacitor electrode and the first and second capacitor nodes such that the first switch has a first position that couples the first capacitor electrode to the first capacitor node and a second position that couples the first capacitor electrode to the second capacitor node. The second switch is coupled between the second capacitor electrode and the first and second capacitor nodes such that the second switch has a first position that couples the second capacitor electrode to the first capacitor node and a second position that couples the second capacitor electrode to the second capacitor node.

17 Claims, 1 Drawing Sheet

CAPACITOR ARRANGEMENT IN A SEMICONDUCTOR COMPONENT AND DRIVING APPARATUS

This application is a continuation of co-pending International Application No. PCT/DE2004/002301, filed Oct. 15, 2004, which designated the United States and was not published in English, and which is based on German Application No. 103 49 557.6 filed Oct. 22, 2003, both of which applications are incorporated herein by reference.

TECHNICAL FIELD

The invention relates to a capacitor arrangement in a semiconductor component having a first capacitor electrode, a second capacitor electrode and a dielectric that is surrounded by the capacitor electrodes, it being possible to apply a capacitor voltage to the capacitor electrodes.

BACKGROUND

The invention also relates to a method for driving a capacitor in a semiconductor component, a capacitor voltage being applied to the capacitor electrodes.

Capacitors constitute basic components of semiconductor technology and may undertake various functions within a semiconductor component. In this case, two different operating modes, unipolar operation and bipolar operation, are essentially considered. In this case, unipolar operation is understood as meaning that a voltage having the same polarity but not necessarily the same amplitude is applied to the capacitor. Applying a DC voltage that has the same polarity and the same amplitude is thus a special form of unipolar operation. Bipolar operation is understood as meaning that a voltage having alternating polarity is applied.

Depending on the operating mode, capacitors that are operated in a unipolar manner are used, for example, to protect against current spikes within the semiconductor component, and bipolar capacitors are used to filter signals.

It is known that integrated capacitors have a limited lifetime which, in addition to various operating parameters such as temperature and the applied voltage, is directly associated with the thickness of the dielectric used.

It has been proven using experiments that particular dielectrics used in the semiconductor region have a longer lifetime during bipolar operation than during unipolar operation. Either a higher thickness of the dielectric or else a shorter lifetime must, therefore, be accepted for capacitors that are operated in a unipolar manner.

SUMMARY OF THE INVENTION

Therefore, the invention is based on the object of providing a circuit arrangement and a method for driving a capacitor, which avoids the disadvantages of a capacitor that is operated in a unipolar manner.

The object on which the invention is based is achieved by means of a capacitor circuit arrangement by virtue of the fact that a changeover arrangement having a first input and a second input and a first output and a second output is provided. In this case, in order to externally connect the capacitor, the first input constitutes the terminal for the first capacitor electrode and the second input constitutes the terminal for the second capacitor electrode. The changeover arrangement has two outputs that are designed in such a manner that the first output is connected to the first capacitor electrode and the second output is connected to the second capacitor electrode.

In a first switch position in the changeover arrangement, the first input is connected to the first output and the second input is connected to the second output and, in a second switch position, the first input is connected to the second output and the second input is connected to the first output. This capacitor circuit arrangement makes it possible to change the polarity at the capacitor electrodes.

In one expedient refinement of the invention, the changeover arrangement has a control input, which is connected to a control signal generator, which thus enables a changeover operation that can be electronically switched from the outside.

The object on which the invention is based is also achieved by means of a driving method that drives the capacitor circuit arrangement in such a manner that the capacitor voltage is applied, with alternating polarity, during an overall period of time in such a manner that it is applied with a first polarity during first periods of time and with a second polarity that is opposite to the first polarity during second periods of time.

BRIEF DESCRIPTION OF THE DRAWINGS

The invention shall be explained in more detail below with reference to two exemplary embodiments. In the associated drawings.

Figure 1:
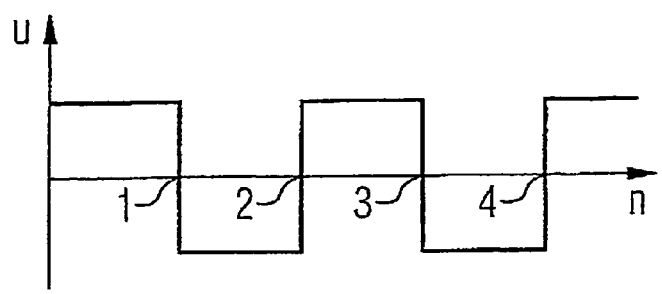
FIG. 1 shows an inventive distribution of the polarity of the capacitor voltage.

The following list of reference symbols can be used in conjunction with the figures:

| | |
|---|---|
| 1 | Capacitor |
| 2 | Changeover arrangement |
| 3 | First input |
| 4 | Second input |
| 5 | First switch |
| 6 | Second switch |
| 7 | Control line |
| 8 | First output |
| 9 | Second output |
| N | Event |

DETAILED DESCRIPTION OF ILLUSTRATIVE EMBODIMENTS

As illustrated in the drawings, the polarity at the capacitor 1 changes as a result of a regular event N, which can be selected depending on the application. The event N is formed by applying the operating voltage to the semiconductor component or by an internally generated clock.

In this exemplary embodiment, the capacitor comprises two TiN electrodes and an SiN dielectric, which is surrounded by the electrodes.

Figure 3:
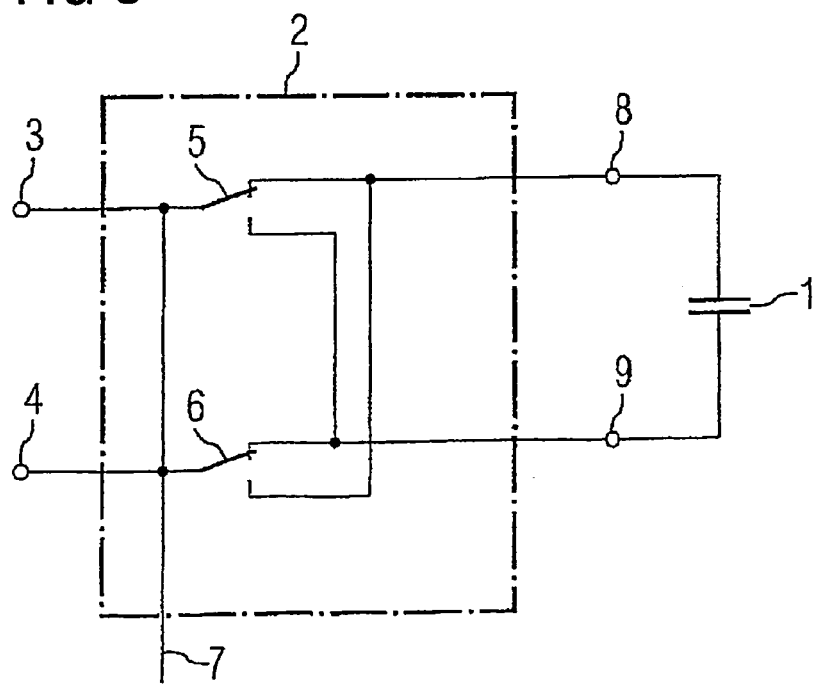
FIG. 3 shows a capacitor circuit arrangement according to the invention.

FIG. 3 illustrates a changeover arrangement 2 that is implemented using conventional components and is intended to reverse the polarity at the capacitor 1. The capacitor circuit arrangement includes a first input 3 and a second input 4 as well as a changeover arrangement 2 that contains a first switch 5 and a second switch 6. Both switches can be electronically controlled using a control line 7. The changeover arrangement 2 has a first output 8 and a second output 9 which equally constitute the inputs of the capacitor 1.

Figure 2:
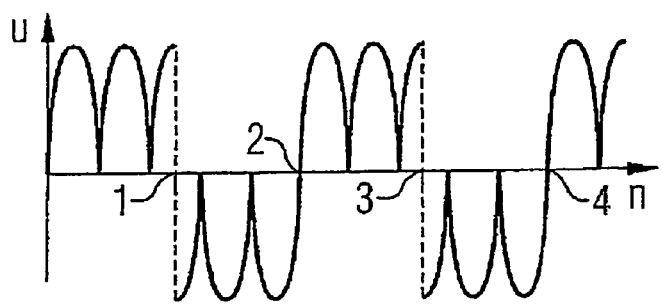
FIG. 2 shows an inventive distribution of the polarity of the capacitor voltage as a pulsating DC voltage.

If a control signal that is triggered by an event N is applied to the control line 7, the switches 5 and 6 are operated and the connections between the first input 3 and the first output 8 and between the second input 4 and the second output 9 are mutually interchanged. Depending on the signal applied and on the basis of the event N, capacitor voltage profiles as illustrated in FIG. 1 or FIG. 2 thus result.

The effect achieved in this case is that it becomes possible to now operate a capacitor, which has previously been operated in a purely unipolar manner, in a bipolar manner using a change in polarity and thus to significantly extend the lifetime of the capacitor.

In order to make optimum use of the effect to extend the lifetime of the capacitor, the stress levels of both polarities should compensate for each other.

For applications in which the capacitor is operated using a DC voltage, it is, therefore, necessary for the cumulated time during which the capacitor is operated with the first polarity to be approximately equal to the cumulated time during which the capacitor is operated with the second polarity. This type of application is preferred for use of the invention.

For applications in which the capacitor is operated using a voltage that varies over time, the time integral from the product of time and a suitable function of the voltage must be approximately compensated for with both polarities.

In order to carry out the method according to the invention, the originally applied capacitor voltage may be both a constant DC voltage and/or a pulsating DC voltage. The method can thus be applied to all capacitors that are operated in a unipolar manner.

In order to achieve the desired effect, the first and second periods of time may be seconds to weeks.

In another variant of the method according to the invention, the changeover arrangement is driven using a control signal. This has the advantage of possible automation of the changes in polarity of the capacitor voltage. It is possible to use the application of the operating voltage to the semiconductor component as the control signal. It is also possible to use an internally generated clock as the control signal. The advantage of one of these two embodiments of the method is that the polarity of the capacitor voltage is changed over in a completely automatic manner.

The considerable extension of the lifetime of the capacitor, which is achieved by means of the invention, can be used to increase the reliability and lifetime of the capacitor and thus of the overall semiconductor component. On the other hand, it is possible to reduce the thickness of the dielectric, which is required for a desired lifetime, and thus to reduce the space required by the capacitor in the semiconductor component.

What is claimed is:

1. A semiconductor device comprising:
a first capacitor node;
a second capacitor node;
a first capacitor electrode;
a second capacitor electrode;
a capacitor dielectric disposed between the first capacitor electrode and the second capacitor electrode;
a first switch coupled between the first capacitor electrode and the first and second capacitor nodes such that the first switch has a first position that couples the first capacitor electrode to the first capacitor node and a second position that couples the first capacitor electrode to the second capacitor node; and
a second switch coupled between the second capacitor electrode and the first and second capacitor nodes such that the second switch has a first position that couples the second capacitor electrode to the first capacitor node and a second position that couples the second capacitor electrode to the second capacitor node.

2. The device of claim 1, further comprising a single control line coupled to both the first switch and the second switch.

3. The device of claim 2, wherein the single control line carries a control periodic signal.

4. The device of claim 1, wherein the first capacitor node always carries a voltage that is greater than or equal to a voltage carried on the second capacitor node.

5. The device of claim 4, wherein the first capacitor node carries a fixed voltage.

6. The device of claim 2, wherein a control signal is triggered by an event.

7. the device of claim 1, wherein the semiconductor device is operated in a bipolar manner.

8. The device of claim 1, wherein applying a capacitor voltage comprises applying a constant DC voltage.

9. The device of claim 1, wherein applying a capacitor voltage comprises applying both a constant DC voltage and a pulsating voltage.

10. A semiconductor device comprising:
a first capacitor electrode;
a second capacitor electrode;
a dielectric between the first capacitor electrode and the second capacitor electrode;
a changeover arrangement having a first input and a second input and a first output and a second output, wherein, in order to connect the capacitor, the first input constitutes a terminal for the first capacitor electrode and the second input constitutes a terminal for the second capacitor electrode, and the first output is connected to the first capacitor electrode and the second output is connected to the second capacitor electrode, and in which case, in a first switch position in the changeover arrangement, the first input is connected to the first output and the second input is connected to the second output and, in a second switch position, the first input is connected to the second output and the second input is connected to the first output.

11. The device of claim 10, wherein the changeover arrangement has a control input that controls the switch position.

12. The device of claim 11, wherein the control input is coupled to a control signal generator.

13. The device of claim 12, wherein the control signal generator generates a periodic control signal.

14. The device of claim 10, wherein the first input always carries a voltage that is greater than or equal to a voltage carried on the second input.

15. The device of claim 14, wherein the first input carries a fixed voltage.

16. The device of claim 12, wherein the control signal generator generates a control signal triggered by an event.

17. The device of claim 10, wherein the semiconductor device is operated in a bipolar manner.

* * * * *